United States Patent
Ramirez

(10) Patent No.: US 11,626,789 B2
(45) Date of Patent: Apr. 11, 2023

(54) ELECTRICITY METER PRIMARY ENERGY HOLDUP MANAGEMENT

(71) Applicant: Landis+Gyr Innovations, Inc., Alpharetta, GA (US)

(72) Inventor: Anibal Ramirez, Indianapolis, IN (US)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 181 days.

(21) Appl. No.: 17/122,567

(22) Filed: Dec. 15, 2020

(65) Prior Publication Data
US 2022/0190635 A1    Jun. 16, 2022

(51) Int. Cl.
| H02J 7/34 | (2006.01) |
| H02M 1/00 | (2006.01) |
| H02J 9/00 | (2006.01) |
| G01R 22/06 | (2006.01) |
| H02J 9/06 | (2006.01) |

(52) U.S. Cl.
CPC .......... *H02M 1/0096* (2021.05); *H02J 7/345* (2013.01); *H02J 9/005* (2013.01); *G01R 22/061* (2013.01); *G01R 22/068* (2013.01); *H02J 9/061* (2013.01)

(58) Field of Classification Search
CPC ......... H02J 9/04–062; H02J 9/067–068; H02J 7/34–345; H02M 1/0096; G06F 1/263; G06F 1/30–305; G01R 22/061–068; Y04S 20/30; G01D 4/002–006
See application file for complete search history.

(56) References Cited

U.S. PATENT DOCUMENTS

| 5,170,070 A | * | 12/1992 | Hattori | ............... H02M 3/28 307/64 |
| 11,041,738 B1 | * | 6/2021 | Mimlitz | ............... G01D 4/004 |
| 2004/0128085 A1 | | 7/2004 | Ramirez | |
| 2004/0156217 A1 | | 8/2004 | Phadke | |

(Continued)

FOREIGN PATENT DOCUMENTS

WO    WO-2016031098 A1 *    3/2016    ............... H02J 7/34

OTHER PUBLICATIONS

International Application No. PCT/US2021/062730, International Search Report and Written Opinion dated Apr. 8, 2022, 12 pages.

(Continued)

*Primary Examiner* — Toan T Vu
*Assistant Examiner* — David A Shiao
(74) *Attorney, Agent, or Firm* — Kilpatrick Townsend & Stockton LLP

(57) ABSTRACT

A utility meter includes: a rectifier configured to rectify AC voltage from a power grid to generate a primary DC voltage supply; and a primary holdup circuitry, including: first capacitors coupled to a primary DC voltage rail and configured to store energy from the primary voltage supply; a switch coupled to the first capacitors; and a control circuit configured to control the primary holdup circuitry, wherein the control circuit is configured to: determine that a secondary DC voltage of a secondary voltage supply is approximately equal to a first specified threshold voltage; and generate a control signal to causes the switch to turn on and cause the one or more first capacitors to release a portion of the energy stored in the one or more first capacitors to the primary DC voltage rail.

19 Claims, 6 Drawing Sheets

(56) References Cited

U.S. PATENT DOCUMENTS

| | | | | |
|---|---|---|---|---|
| 2007/0096769 A1* | 5/2007 | Shuey | ................... | G01R 22/00 |
| | | | | 324/142 |
| 2011/0241637 A1* | 10/2011 | Parker | .................... | H02J 9/061 |
| | | | | 323/282 |
| 2011/0242715 A1* | 10/2011 | Voisine | ................. | G01D 4/004 |
| | | | | 361/65 |
| 2013/0021021 A1 | 1/2013 | Ramirez | | |
| 2013/0054165 A1* | 2/2013 | Ramirez | ............. | G01R 22/061 |
| | | | | 702/62 |
| 2015/0212122 A1* | 7/2015 | Sobotka | ................ | G01D 4/002 |
| | | | | 324/142 |
| 2016/0141964 A1* | 5/2016 | Yu | .......................... | H02M 1/36 |
| | | | | 363/21.02 |

OTHER PUBLICATIONS

When the Power Fails: Designing for a Smart Meter's Last Gasp, EDN, Available Online at: https://www.edn.com/when-the-power-fails-designing-for-a-smart-meters-last-gasp/, Jun. 7, 2012, pp. 1-5.

* cited by examiner

ELECTRICITY METER PRIMARY ENERGY HOLDUP MANAGEMENT

BACKGROUND

Unless otherwise indicated herein, the materials described in this section are not prior art to the claims in this application and are not admitted to be prior art by inclusion in this section.

An electricity meter measures electrical power consumed by a customer of an electric utility provider. The electricity meter is plugged into a meter socket that is mounted in an enclosure on a building or other structure, and draws its operating power from the electrical power distribution grid. Electricity meters record electric energy consumption and communicate the information as well as status information of the meter itself to the utility provider for monitoring and billing. When power outages occur, an electricity meter no longer has the ability to communicate with the utility provider.

In order to operate a radio to enable the electricity meter to provide a "last gasp" communication to the utility provider when a power outage occurs, electricity meters may be equipped with a back-up power supply. The back-up power supply may provide power to the electricity meter only for a brief period of time sufficient for the meter to transmit the last gasp communication. In some cases, the back-up power supply may be one or more low voltage capacitors that provide the back-up power for radio operation. The capacitors needed to store sufficient energy to operate the radio for a long enough period of time can be large and expensive.

SUMMARY

Systems and methods for primary energy management for an electricity meter may be provided.

According to various aspects of the present disclosure there is provided a utility meter. In some aspects, the utility meter may include: a rectifier configured to rectify alternating current (AC) voltage from a power grid to generate a primary direct current (DC) voltage supply; and primary holdup circuitry. The primary holdup circuitry may include one or more first capacitors coupled to a primary DC voltage rail and configured to store energy from the primary voltage supply; a switch coupled to the one or more first capacitors; and a control circuit configured to control the primary holdup circuitry. The control circuit may be configured to determine that a secondary DC voltage of a secondary voltage supply derived from the primary DC voltage supply is approximately equal to a first specified threshold voltage; and generate a control signal to cause the switch to turn on and cause the one or more first capacitors to release a portion of the energy stored in the one or more first capacitors to the primary DC voltage rail.

According to various aspects of the present disclosure there is provided a primary holdup circuit. In some aspects, the primary holdup circuit may include one or more first capacitors coupled to a primary DC voltage rail and configured to store energy from a primary voltage supply; a switch coupled to the one or more first capacitors; and a control circuit configured to control the primary holdup circuitry. The control circuit may be configured to determine that a secondary DC voltage derived from the primary DC voltage supply is approximately equal to a first specified threshold voltage; and generate a control signal to cause the switch to turn on and cause the one or more first capacitors to release a portion of the energy stored in the one or more first capacitors to the primary DC voltage rail.

According to various aspects of the present disclosure there is provided a method of operating a utility meter during a power outage. In some aspects, the method may include: determining, by a control circuit, that a power outage occurred on an alternating current (AC) power grid based on sensing a secondary direct current (DC) voltage derived from the AC power grid approximately equal to a first specified threshold DC voltage; generating, by the control circuit, a control signal to a primary holdup circuit comprising one or more first capacitors coupled to a primary DC voltage rail and configured to store energy from a primary voltage supply, and a switch coupled to the one or more first capacitors. The control signal may cause the switch to turn on and cause the one or more first capacitors to release a portion of the energy stored in the one or more first capacitors to the primary DC voltage rail.

BRIEF DESCRIPTION OF THE DRAWINGS

Aspects and features of the various embodiments will be more apparent by describing examples with reference to the accompanying drawings, in which.

DETAILED DESCRIPTION

Figure 1:
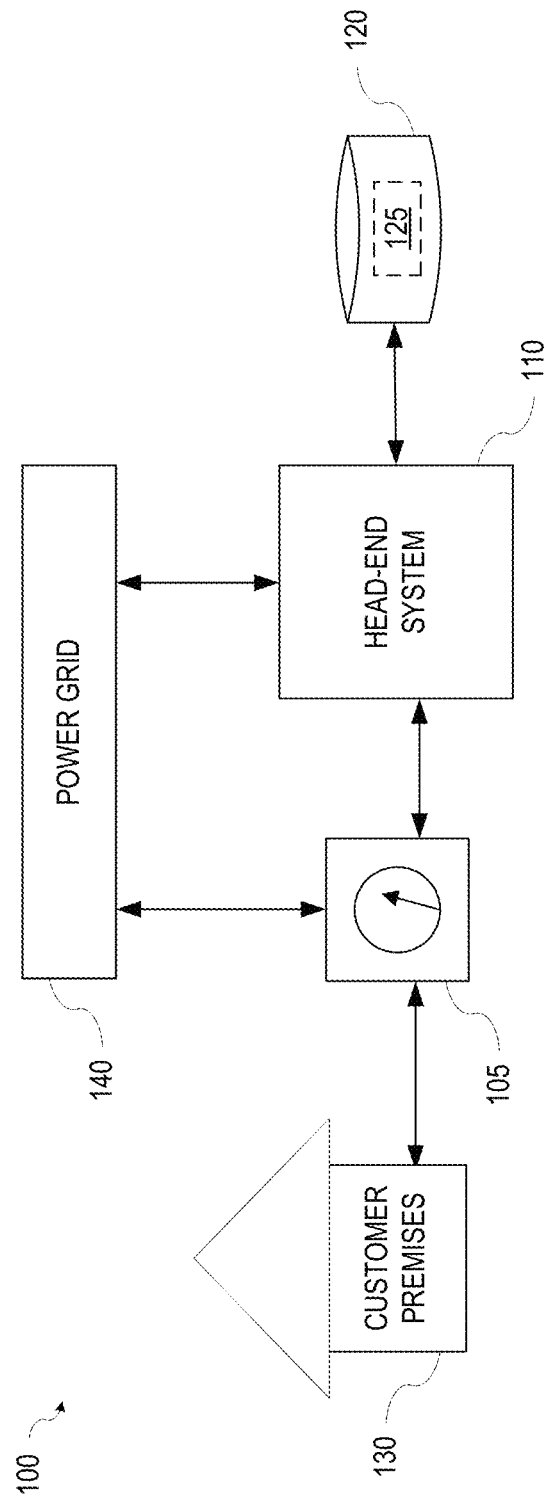
FIG. 1 is a simplified diagram illustrating a utility management system according to some aspects of the present disclosure.

An electricity meter measures electrical power consumed by a customer of an electric utility provider. The electricity meter is plugged in to a meter socket that is mounted in an enclosure on a building or other structure and provides a connection between the electric power delivered by the electrical utility and the customer. The electricity meter measures and controls the electricity delivered to the customer premises via the grid. The electricity meter may be combined with a communications module to enable the meter to communicate with other meters and with the utility. The electricity meter may be part of a utility management system.

Electricity meters may derive power from the alternating current (AC) mains to which they are connected. The AC voltage may be rectified to develop a primary direct current (DC). The electricity meters may also be equipped with a power supply, which may be a switching power supply also referred to as an off-line switcher, configured to convert the primary DC voltage to a lower secondary DC voltage suitable for operating components of the electricity meter. The off-line switcher power supply may also provide electrical isolation (e.g., galvanic isolation) between circuitry connected to the primary DC voltage and circuitry connected to the secondary DC voltage.

During an AC power outage, the electricity meter can no longer derive its power from the AC mains, and requires sufficient stored energy, referred to herein as primary holdup energy, to operate the off-line switcher for a brief period of time sufficient for the electricity meter to transmit a "last gasp" communication, such as an indication of an AC power outage, during the AC power outage. The last gasp communication may be transmitted to a receiver such as the head-end system, another utility meter, or a mobile device with, for example, an Advanced Metering Infrastructure (AMI) radio or an Automatic Meter Reading (AMR) radio of the electricity meter. In some cases, the last gasp communication may require several attempts before the transmission is successful. Simply providing a bank of capacitors across the primary DC voltage rail of the electricity meter to provide the necessary holdup energy for the off-line switcher to power the AMI radio and/or the AMR radio and other AMI or AMR devices over a long period (e.g., 60 seconds) was not practical due to power losses in the off-line switcher.

Aspects of the present disclosure can provide improvements to the efficiency of the off-line switcher with primary holdup energy at light secondary loads over a long period, for example 60 seconds or more, during an AC power outage. Control circuitry in the electricity meter may turn the off-line switcher on and off on demand to satisfy the DC requirements of the AMI radio and/or AMR radio and other AMI or AMR devices. This control can also to improve efficiency of the off-line switcher at low secondary loads. During an AC power outage, the idle losses in the fly-back converter can be reduced to enable AMI or AMR radios and other AMI or AMR devices to remain active during long periods of time (e.g., greater than 60 seconds).

While certain embodiments are described, these embodiments are presented by way of example only, and are not intended to limit the scope of protection. The apparatuses, methods, and systems described herein may be embodied in a variety of other forms. Furthermore, various omissions, substitutions, and changes in the form of the example methods and systems described herein may be made without departing from the scope of protection.

FIG. 1 is a simplified diagram illustrating a utility management system 100 according to some aspects of the present disclosure. Referring to FIG. 1, the utility management system 100 may include an electricity meter 105, a head-end system 110, and a storage device 120. While FIG. 1 illustrates one electricity meter 105 for ease of explanation, one of ordinary skill in the art will appreciate that a plurality of electricity meters 105 may be included in the disclosed utility management system 100 without departing from the scope of the present disclosure.

The electricity meter 105 may monitor and/or record the energy usage at the customer premises 130 and communicate the information about energy usage to the head-end system 110. For example, the electricity meter 105 may continually monitor and record total energy usage at the customer premises 130. In accordance with various aspects of the present disclosure, the electricity meter 105 may monitor and/or record days of the week and times of the day related to energy usage at the customer premises 130 and communicate the information to the head-end system 110. In addition, the electricity meter 105 may perform as a sensor to detect and/or record abnormal measurements and/or events, for example, but not limited to, AC power outages. One of ordinary skill in the art will appreciate that other information, for example, but not limited to, average power consumed, peak power, etc., may be monitored and communicated by the electricity meter 105.

The electricity meter 105 may communicate with the head-end system 110 via wired or wireless communication interfaces known to those of skill in the art using communication protocols appropriate to the specific communication interface. Different wired or wireless communication interfaces and associated communication protocols may be implemented on the electricity meter 105 for communication with the head-end system 110. For example, in some implementations a wired communication interface may be implemented, while in other implementations a wireless communication interface may be implemented for communication between the electricity meter 105 and the head-end system 110. In some embodiments, a wireless mesh network may connect a plurality of electricity meters 105. The plurality of electricity meters 105 may transmit data to a collector (not shown) that communicates with another network to transmit the data to the head-end system 110. The electricity meters 105 may use radio frequency (RF), cellular, or power line communication to communicate. In some implementations, the electricity meter 105 may be an Advanced Metering Infrastructure (AMI) meter or an Automatic Meter Reading (AMR) meter and may include an AMI radio or an AMR radio. Other communication methods may be used without departing from the scope of the present disclosure.

The head-end system 110 may include a data storage device 120. The data storage device 120 may be, for example, but not limited to, one or more hard-disk drives, solid-state memory devices, or other computer-readable storage media. One of ordinary skill in the art will appreciate that other storage configurations may be used without departing from the scope of the present disclosure. A database 125 may be stored on the data storage device 120. The database 125 may store information collected from the electricity meters 105. For example, the database 125 may include days of the week and times of the day correlating with load is operating information, for example, but not limited to, average power consumed by the load, peak power consumed by the load, etc. One of ordinary skill in the art will appreciate that this information is exemplary and that other information may be included in the database 125 without departing from the scope of the present disclosure.

The head-end system 110 and the electricity meter 105 may be connected to an electrical power distribution grid 140. The electrical power distribution grid 140 may include generating stations (not shown) that produce electric power (not shown), electrical substations (not shown) for stepping electrical voltage up for transmission or stepping electrical voltage down for distribution, high voltage transmission lines (not shown), and distribution lines (not shown).

Figure 2:
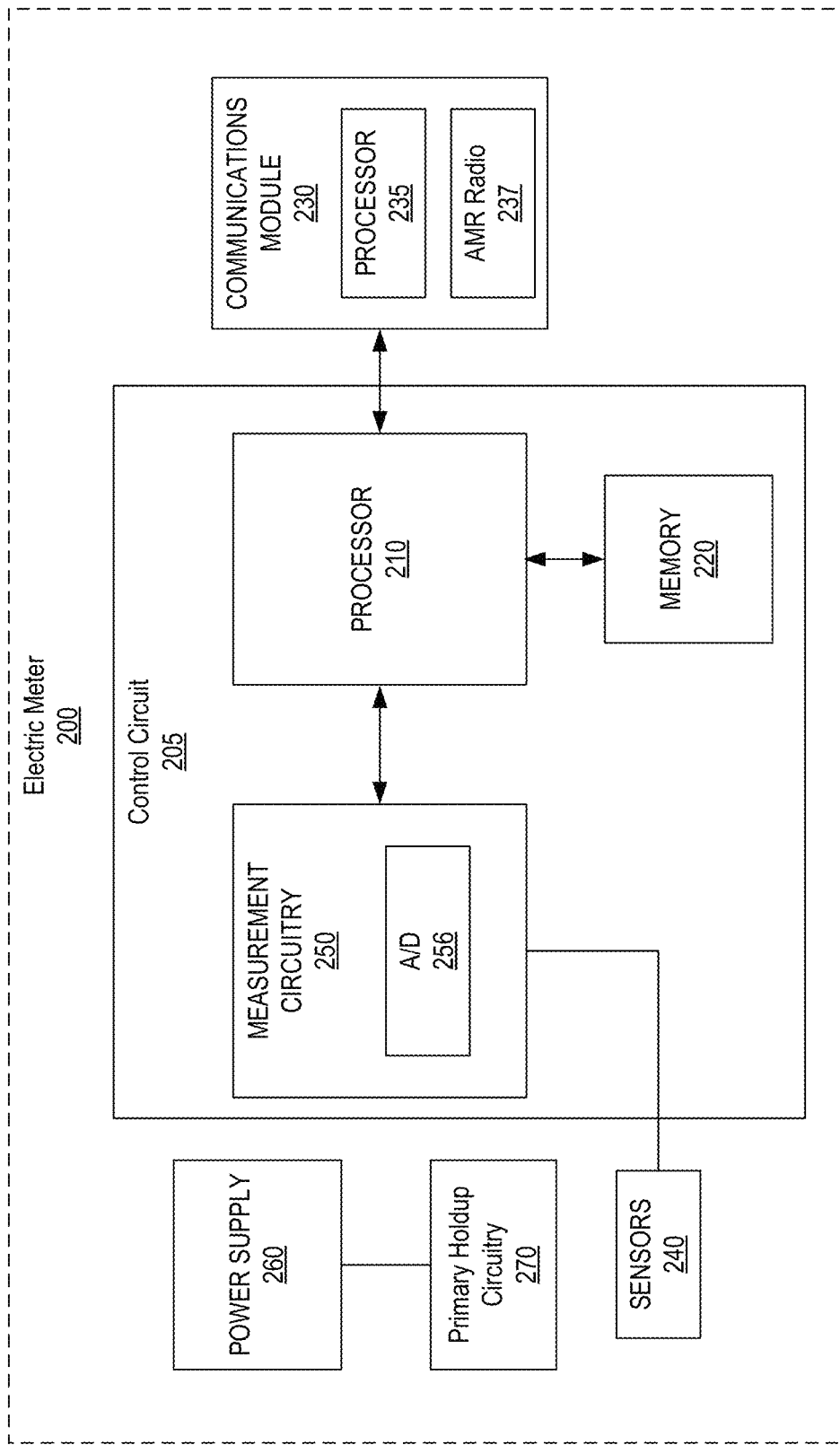
FIG. 2 is a simplified block diagram illustrating an electricity meter according to some aspects of the present disclosure.

FIG. 2 is a simplified block diagram illustrating an electricity meter 200 according to some aspects of the present disclosure. The electricity meter 200 may be, for example, the electricity meter 105 of FIG. 1. The electricity meter 200 may include a control circuit 205, a communications module 230, various sensors 240, a power supply 260, and primary holdup circuitry 270.

The control circuit 205 may include a processor 210, a memory 220, and measurement circuitry 250. The processor 210 may be a general purpose processor, a digital signal processor (DSP), an application specific integrated circuit (ASIC), a field programmable gate array (FPGA) or other programmable logic device. The processor 210 may be in electrical communication with the memory 220, the communications module 230, and the sensors 240. The processor 210 may control overall operation of the electricity meter

200. The processor 210 may receive data generated by various sensors 240 of the electricity meter 200 including, but not limited to, energy use, voltage, current, etc., and may perform operations on, or processing of, the data. The processor 210 may communicate with the communications module 230 to transmit various operational parameters (e.g., energy usage), diagnostic data (e.g., error conditions), or other electricity meter information (e.g., GPS coordinates) to a head-end system and/or to other electricity meters via a wired or wireless network.

The memory 220 may be a storage device such as a solid state storage device or other storage device, and may be a combination of volatile and non-volatile storage or memory. In some implementations, portions of the memory may be included in the processor 210. The memory 220 may be configured to store instructions executable by the processor 210, as well as data generated by the various sensors 240 of the electricity meter 200, and other applications executable by the processor 210.

The communications module 230 may be a wired or wireless transceiver operable to communicate via various wired or wireless protocols as known in the field for example, but not limited to the AMI protocols. The communications module 230 may include a processor 235 configured to control operation of the communications module 230. The communications module 230 may enable the electricity meter 200 to communicate with other electricity meters in a network (e.g., an AMI network) and with the utility provider (e.g., a head-end system) controlling the network. The communications module 230 may transmit data and alarm signals to the utility provider and receive any of updated program instructions, firmware updates, updates to other settings, or other communications. The communications module 230 may receive capacitor charge and discharge instruction signals 232 from the head-end system (e.g., the head-end system 110) and may communicate the instruction signals to the processor 210. In some implementations, the communications module 230 may include AMI devices and/or AMR devices, including an AMI radio and/or an AMR radio 237. The AMI radio and/or AMR radio may transmit data to and receive data from the head-end system using radio frequency (RF) technologies or power line communication (PLC).

The sensors 240 may include, but are not limited to, voltage sensors, current sensors, accelerometers, tilt switches, temperature sensors, and other sensors configured to monitor electrical and physical characteristics of the electricity meter 200.

The measurement circuitry 250 may interface with the sensors 240. The measurement circuitry 250 may include an analog-to-digital (A/D) converter 256 configured to measure the capacitor voltage and may convert the capacitor voltage values to digital values. The analog-to-digital (A/D) converter 256 may be configured to receive signals from the sensors 240 and convert the signal to digital values that may be operated on by the processor 210.

The power supply 260 may be a switching power supply, also referred to herein as an off-line switcher. The power supply 260 may be configured to convert a primary DC voltage to a lower secondary DC voltage. The power supply 260 may also include secondary power supplies that convert the secondary DC voltage to lower voltages suitable for operating components of the electricity meter.

The primary holdup circuitry 270 may provide power to the electricity meter 200 for a period of time immediately after an AC power outage. Capacitors included in the primary holdup circuitry 270 may be controlled by the control circuit 205 to provide sufficient power for the electricity meter 200 to transmit a "last gasp" message via the AMI radio or the AMR radio 237 to the head-end system. The last gasp message may include a notification of the AC power outage as well as other information (e.g., energy usage, error conditions, or other electricity meter information) at the time power was lost.

Figure 3:
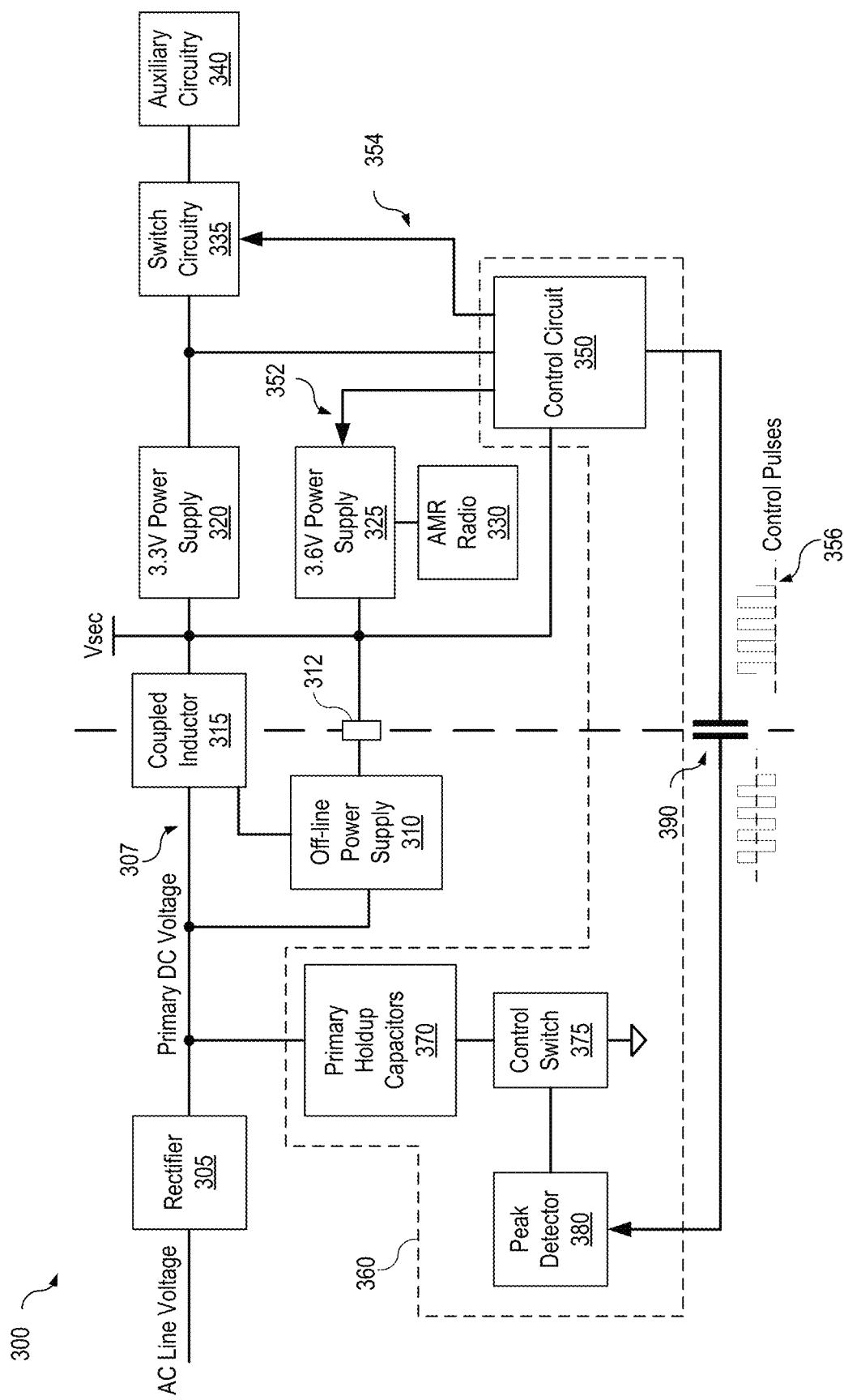
FIG. 3 is a simplified block diagram of an electricity meter including primary holdup circuitry according to some aspects of the present disclosure.

FIG. 3 is a simplified block diagram of an electricity meter 300 including primary holdup circuitry 360 according to some aspects of the present disclosure. Referring to FIG. 3, the electricity meter 300 may include a first power supply 310, a second power supply 320, a third power supply 325, a control circuit 350, and primary holdup circuitry 360. The first power supply 310, also referred to herein as the off-line power supply or off-line switcher, may operate with an input voltage from a primary DC voltage of the electricity meter 300. The primary DC voltage may be a generated from an AC line voltage rectified by a full wave rectifier 305. The primary DC voltage may be may be, for example, 350 volts DC (VDC) or another DC voltage.

The first power supply 310 may be a switching power supply, for example, but not limited to a buck-boost power supply or other power supply, operable to convert the primary DC voltage into a lower secondary DC voltage Vsec. The secondary DC voltage Vsec may be for example, 12 VDC or another DC voltage. The first power supply 310 may convert the primary DC voltage to the secondary DC voltage Vsec by periodically transferring energy stored in the primary winding of the coupled inductor 315 to the secondary winding of the coupled inductor 315. Electrical isolation (e.g., galvanic isolation) between circuitry connected to the primary DC voltage and circuitry connected to the secondary DC voltage may be provided by the coupled inductor 315. In some implementations, the coupled inductor 315 may be a transformer. Isolated feedback of the secondary DC voltage Vsec may be provided to the first power supply 310 via an isolation device 312, for example, but not limited to, an opto-coupler or other isolation device.

The second power supply 320 may be a switching power supply or other power supply operable to convert the secondary DC voltage Vsec to a lower voltage, for example 3.3 VDC or another DC voltage. The second power supply 320 may supply power for the control circuit 350 as well as other circuitry of the electricity meter 300. The third power supply 325 may be a switching power supply or other power supply operable to convert the secondary DC voltage Vsec to a lower voltage, for example 3.6 VDC or another DC voltage. The second power supply 325 may supply power for the AMI radio or the AMR radio 330.

The primary holdup circuitry 360 may include primary holdup capacitors 370, a primary holdup control switch 375, and a peak detector circuit 380. The primary holdup capacitors 370 may be coupled to the primary DC voltage rail 307 and may store energy while power is supplied from the AC mains. The primary holdup capacitors 370 may include two or more capacitors connected in parallel to provide a specified amount of capacitance. For example, two 220 microfarad (μF) capacitors may be connected in parallel to provide 440 μF of capacitance to store energy from the primary DC voltage rail 307. The primary holdup capacitors 370 may be for example, but not limited to, a set of electrolytic capacitors or other types of capacitors.

The primary holdup control switch 375 may be operable to control discharging of the primary holdup capacitors 370 during an AC power outage. The primary holdup control switch 375 may be, for example, a metal-oxide semiconductor field-effect transistor (MOSFET). The peak detector circuit 380 may activate or deactivate the primary holdup control switch 375 based on control pulses 356 received from the control circuit 350 via the isolation capacitor 390.

The control circuit 350 may determine that an AC power outage has occurred by monitoring the secondary voltage Vsec. When the secondary voltage Vsec is approximately equal to (e.g., within 100 mV or another voltage value) a specified threshold voltage, for example, 3 V or another voltage, the control circuit 350 may determine that an AC power outage has occurred. The control circuit 350, for example, the processor of the control circuit (e.g., the processor 210), may also provide a first control signal 352 to enable and disable the third power supply 325 (e.g., the 3.6 V power supply) and a second control signal 354 to enable and disable the switch circuitry 335. The switch circuitry 335 may connect or disconnect power to the auxiliary circuitry 340 of the electricity meter 300. As used herein, auxiliary circuitry refers to any circuitry that is not required to be operated during an AC power outage. During an AC power outage, the control circuit 350 may generate the second control signal 354 to the switch circuitry 335 to disconnect power to the auxiliary circuitry 340 of the electricity meter 300 that is not required to be operated during the AC power outage.

Figure 4:
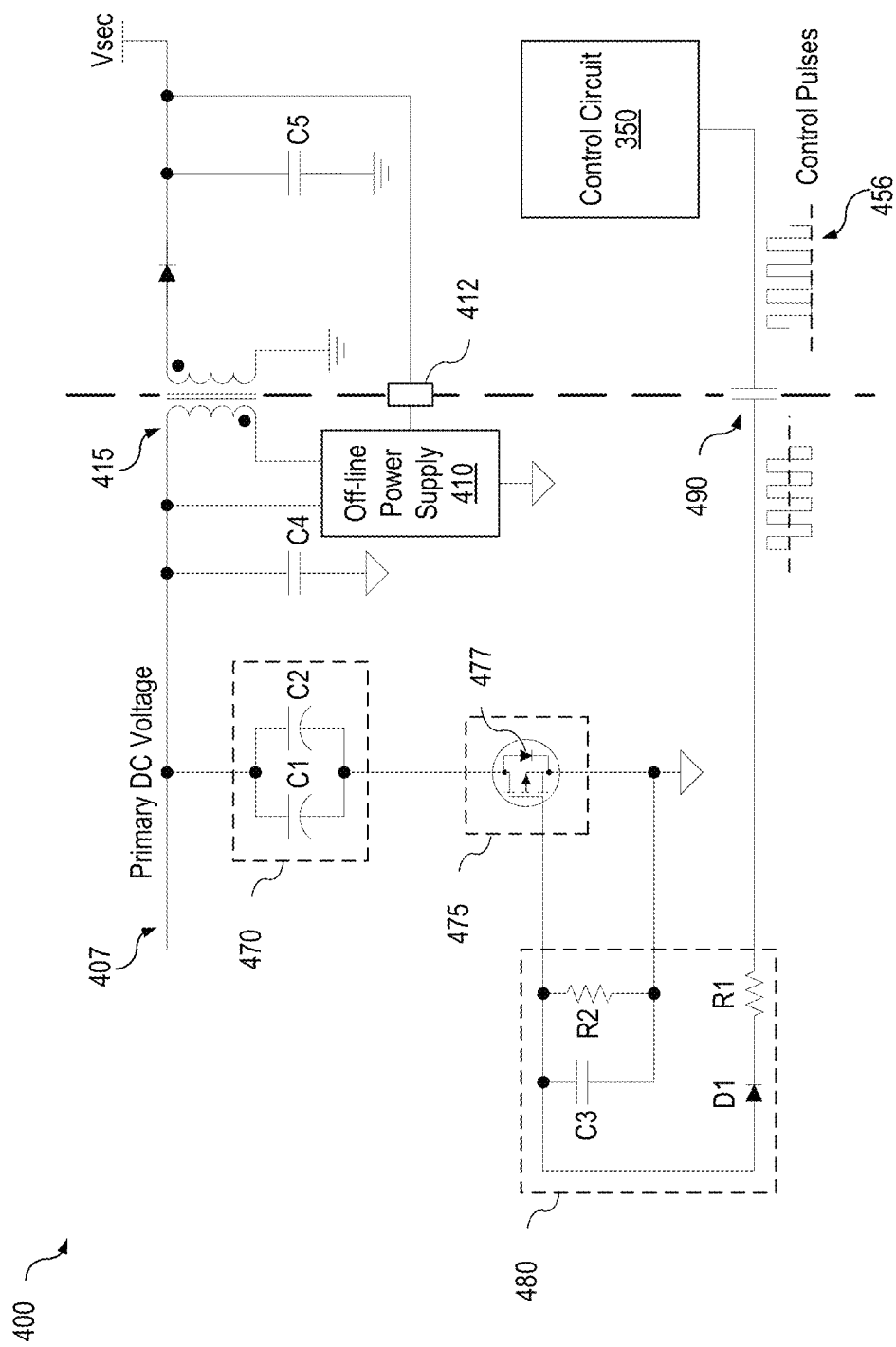
FIG. 4 is a simplified schematic diagram illustrating the primary holdup circuitry according to some aspects of the present disclosure.

FIG. 4 is a simplified schematic diagram illustrating the primary holdup circuitry of an electricity meter 400 according to some aspects of the present disclosure. The primary holdup circuitry may include the control circuit 350, the primary holdup capacitors 470, the primary holdup control switch 475, and the peak detector circuit 480. The primary holdup capacitors 470 can provide the primary holdup energy to sustain the operation of the electricity meter 400 and AMI and/or AMR devices (e.g., the AMI radio and/or the AMR radio 330) during AC power outages. The primary holdup capacitors 470 may be for example, but not limited to, a set of electrolytic capacitors or other types of capacitors connected in parallel to provide sufficient capacitance to store energy from the primary DC voltage rail 407.

The primary holdup control switch 475 may be a field effect transistor (FET) that includes an intrinsic diode 477. The peak detector circuit 480 may include a capacitor and resistor connected in parallel, and a resistor R1 connected in series with a reverse biased diode D1. Other configurations of the primary holdup control switch and peak detector circuit for controlling the charging and discharging of the primary holdup capacitors may be used without departing from the scope of the present disclosure.

During normal operation with the electricity meter 400 powered from the AC mains, the primary side capacitor C4 can provide the primary DC voltage on the primary DC voltage rail 407 to operate the off-line power supply 410. The primary DC voltage may be, for example, 350 VDC or another voltage. The off-line power supply 410 can generate a secondary voltage Vsec of approximately 12 VDC through the coupled inductor 415 to charge the secondary holdup capacitor C5 to its nominal operating voltage of approximately 12 VDC. Isolated feedback of the secondary DC voltage Vsec may be provided to the first power supply 410 via an isolation device 412, for example, but not limited to, on opto-coupler or other isolation device. With the electricity meter 400 powered from the AC mains, the primary holdup control switch 475 enables charging of the primary holdup capacitors 470 to the primary DC voltage through a path provided by the intrinsic diode 477.

The secondary holdup capacitor C5 may provide only a small portion of the total holdup energy for operation of the electricity meter 400, in particular the AMI radio and/or the AMR radio, during an AC power outage. The larger portion of the holdup energy may be stored in the primary holdup capacitors 470. The energy stored in the primary holdup capacitors 470 may be released over a longer period of time, for example 60 seconds or more, under control of the control circuit 350.

During an AC power outage, the primary holdup capacitors 470 no longer charge from the primary DC voltage. The primary holdup control switch 475 may be in an off state and the intrinsic diode 477 may be reversed biased, thereby preventing discharge of the primary holdup capacitors 470. Thus, the holdup energy stored in the primary holdup capacitors 470 may be reserved for later usage. With no power provided by the AC mains, the off-line power supply 410 may continue to operate from the primary DC voltage provided by the primary side capacitor C4. The off-line power supply 410 may continue to operate and continue to charge the secondary side capacitor C5 until the energy stored in the primary side capacitor C4 is depleted to the point where the primary DC voltage is approximately equal to a specified threshold voltage less than a minimum operating voltage for the off-line power supply 410, for example, approximately 60 VDC or another voltage. When the primary DC voltage is approximately equal to the specified threshold voltage, the off-line power supply 410 may turn off.

After the off-line power supply 410 turns off, the secondary side capacitor C5 may provide the necessary holdup energy for the electricity meter 400 and AMI or AMR device (e.g., the AMI radio and/or the AMR radio 330) operation. As the energy stored in the secondary side capacitor C5 is depleted, the secondary voltage Vsec may decrease over time. When the control circuit (e.g., the control circuit 350) determines that the secondary voltage Vsec is approximately equal to (e.g., within 100 mV or another voltage value) a specified threshold, for example, approximately 3 VDC or another threshold voltage, the control circuit 350 may disable the AMI radio and/or the AMR radio 330 via the first control signal 352 to the third power supply 325, may enter a low power mode, and may generate control pulses 456 to cause the primary holdup control switch 475 to turn on. For example, the processor of control circuit 350 (e.g., the processor 210) may receive sensor signals (e.g., from the sensors 240) sensing the secondary voltage Vsec, and generate the control pulses 456 when it determines that the secondary voltage Vsec is approximately equal to the specified threshold. The control pulses 456 may be a pulses waveform having a specified frequency and duty cycle, and may be coupled to the peak detector circuit 480 via a line isolation capacitor 490. The primary holdup control switch 475 may turn on after a time period determined by the frequency and duty cycle of the control pulses 456.

The control pulses 456 received by the peak detector circuit 480 and may cause the detector capacitor C3 in the peak detector circuit 480 to charge. When the voltage on the detector capacitor C3 reaches a turn-on threshold voltage, the primary holdup control switch 475 may turn on causing the primary holdup capacitors 470 to provide a portion of their stored energy to the primary DC voltage rail 407. The energy provided by the primary holdup capacitors 470 may increase the voltage on the primary DC voltage rail 407 above a minimum turn-on voltage, causing the off-line power supply 410 to turn on. The off-line power supply 410 may again generate the secondary voltage Vsec to charge the secondary side capacitor C5.

When the voltage Vsec on the secondary side capacitor C5 exceeds the first specified threshold voltage, for example, approximately 3 VDC or another voltage, the control circuit may wake up and monitor the secondary voltage Vsec. The control circuit may remain in an idle state until it determines that the voltage Vsec on the secondary side capacitor C5 exceeds a second specified threshold voltage, for example, approximately 8 VDC or another voltage. When the control circuit determines that the secondary voltage Vsec has exceeded the second threshold voltage, the control circuit may enable the AMI radio and/or the AMR radio (e.g., via the first control signal 352), and may disable the control pulses. For example, the processor of control circuit 350 (e.g., the processor 210) may receive sensor signals (e.g., from the sensors 240) and disable the control pulses 456 when it determines that the secondary voltage Vsec has exceeded to the second specified threshold voltage. The primary holdup control switch 475 may remain in an on-state, and the primary holdup capacitors 470 may continue to provide energy to the primary DC voltage rail 407 until the charge stored in the detector capacitor C3 decreases to a point where the voltage across the detector capacitor C3 is less than the turn-on threshold voltage of the primary holdup control switch 475.

When the voltage across the detector capacitor C3 discharges (via resistor R3) to less than the turn-on threshold voltage of the primary holdup control switch 475, the primary holdup control switch 475 may turn off and the primary holdup capacitors 470 may no longer provide energy to the primary DC voltage rail 407. Turning off the primary holdup control switch 475 may conserve the energy stored in the primary holdup capacitors 470. The off-line power supply 410 may continue to operate to charge the secondary side capacitor C5 until the energy stored in the primary side capacitor C4 is depleted and the primary DC voltage is again approximately equal to the specified threshold voltage less than the minimum operating voltage for the off-line power supply 410. The charge/discharge cycle may continue until the holdup energy previously stored in primary holdup capacitors 470 is depleted.

Aspects of the present disclosure can provide increased holdup energy to provide sufficient time for the electricity meter to store and transmit status information to the head-end system, another utility meter, or a mobile device. During normal operations, the electricity meter may collect status information including, but not limited to voltage and current information, error conditions, etc. During an AC power outage, the collected status information may be stored and transmitted to the head-end system during a "last gasp" communication. In some cases, transmitting the last gasp communication may take several attempts. The disclosed implementations may provide sufficient energy to power the electricity meter to store and transmit the information via the AMI radio and/or the AMR radio.

Figure 5:
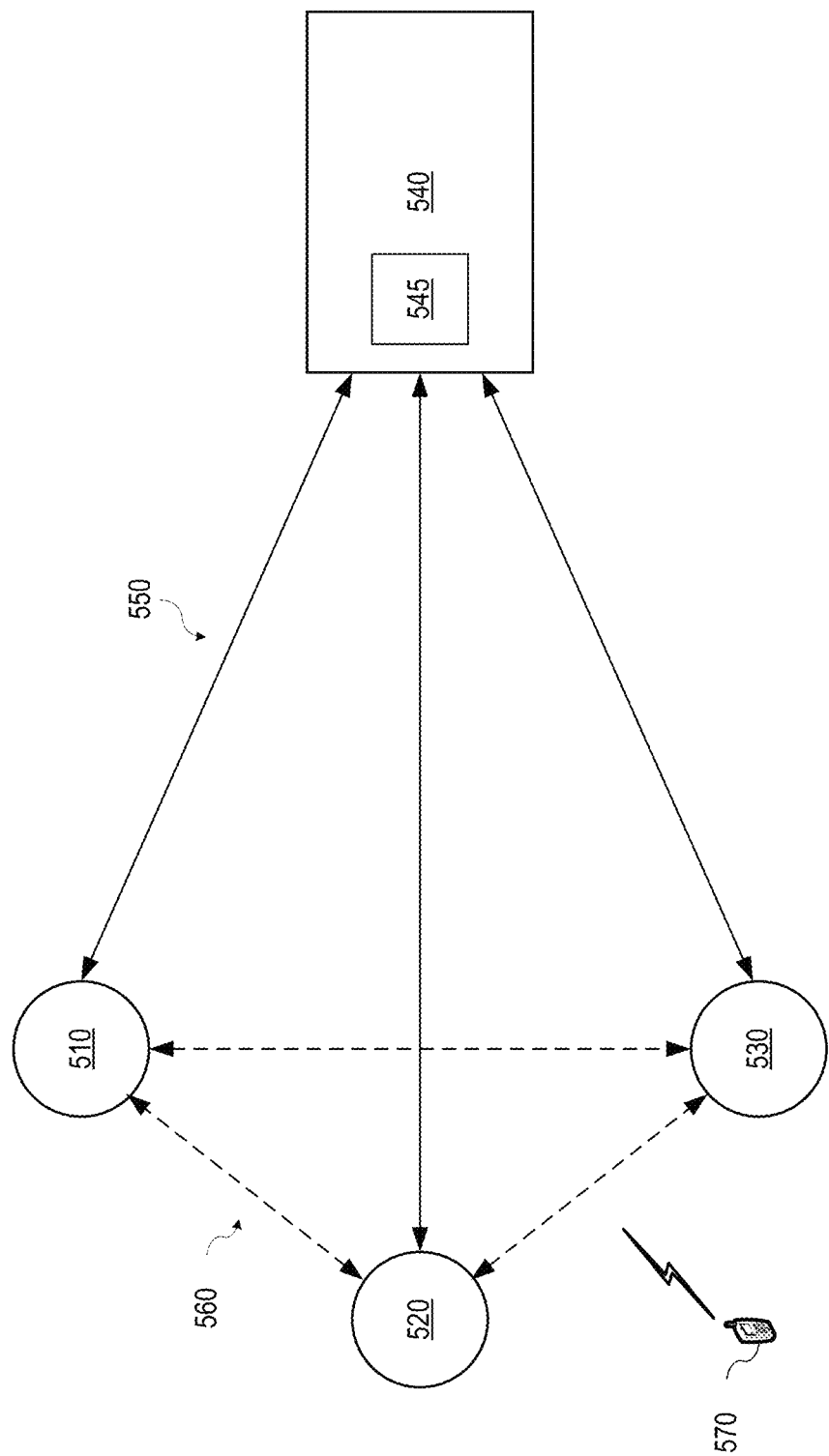
FIG. 5 is a block diagram illustrating communications between electricity meters and a head end system according to some aspects of the present disclosure.

FIG. 5 is a block diagram illustrating communications between electricity meters and a head end system according to some aspects of the present disclosure. Referring to FIG. 5, electricity meters 510, 520, 530 may be in communication with a head-end system 540 via communication links 550 and may be in communication with each other via communication links 560. The head-end system 540 may include a server 545 configured to communicate with electricity meters 510, 520, 530 over a network, for example an Advanced Metering Infrastructure (AMI) network. Each electricity meter 510, 520, 530 may communicate meter information and data with other electricity meters and with the server 545 in the head end system 540. In some cases, an electricity meter, for example electricity meter 520, may be too remote from the head-end system 540 to communicate with it directly. In such cases, the electricity meter 520 may communicate with the head-end system 540 via another electricity meter, for example electricity meter 510. In some cases, the electricity meters 510, 520, 530 may communicate meter information and data with a mobile device 570 such as a mobile phone, laptop computer, or other mobile device.

In some cases, communications between electricity meters and the head-end system may be communicated through additional networks (not shown). Additionally or alternatively, the electricity meters may communicate with one or more edge processing device located topologically closer to the electricity meters than to the head-end system. The edge processing device may have more processing capability than the electricity meters and may provide some of the functionality typically provided by the head-end system.

The electricity meters 510, 520, 530 may communicate with each other via communication links 560 to exchange meter information and data. For example, if electricity meter 510 experiences a loss of line voltage, electricity meter 510 may communicate with electricity meter 520 and electricity meter 530 to determine if the failure is local to electricity meter 510 or whether the failure is a more widespread fault caused by a common condition. A common condition may be, for example, downed power lines due to a storm. The common condition may then be reported to the head-end system by one or more of the electricity meters. Additionally or alternatively, an edge processing device may receive data from the electricity meters and determine whether the data indicates a common condition affecting the electricity meters.

Figure 6:
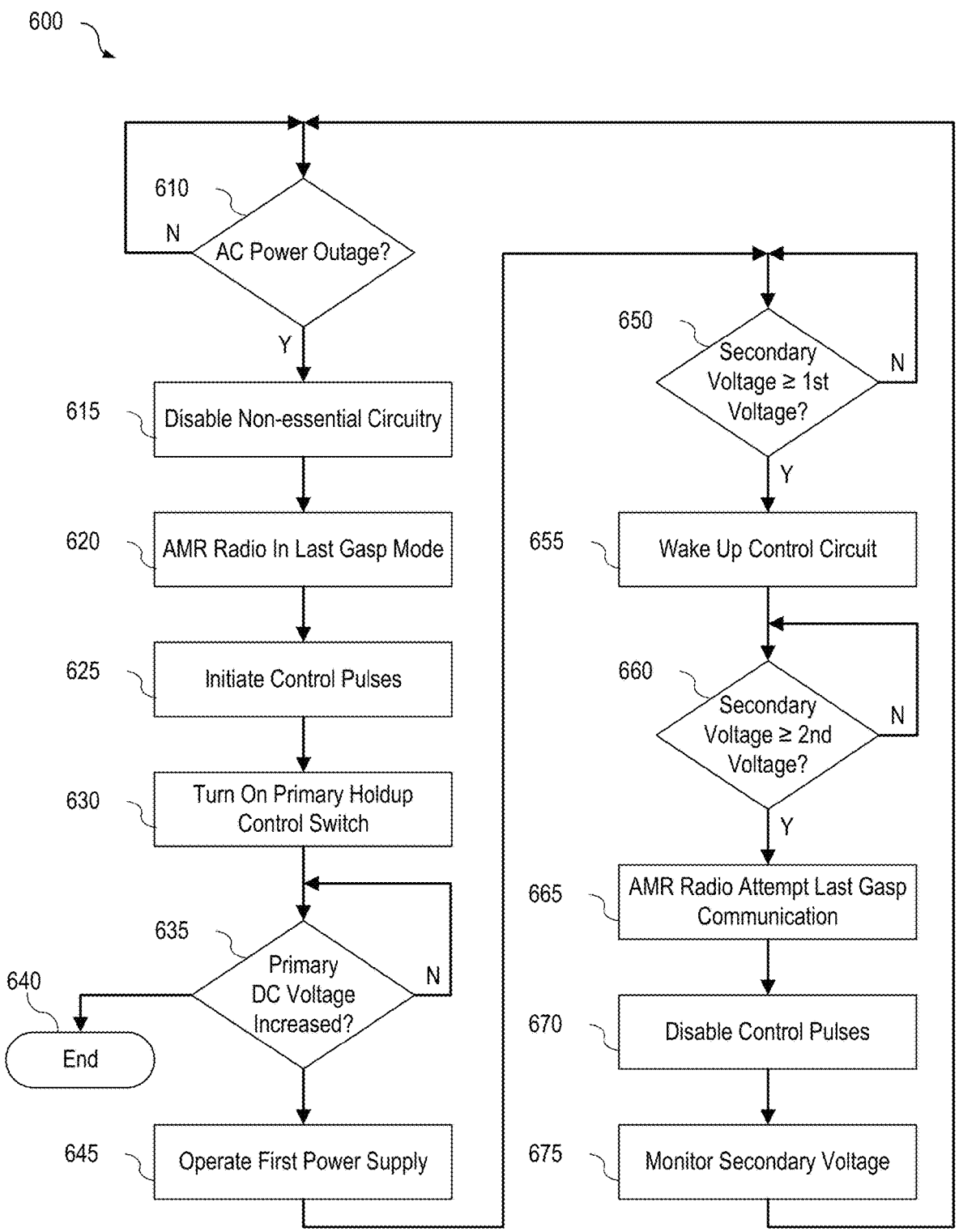
FIG. 6 is a flowchart illustrating a method for operating an electricity meter during an AC power outage according to some aspects of the present disclosure.

FIG. 6 is a flowchart illustrating a method 600 for operating an electricity meter during an AC power outage according to some aspects of the present disclosure. Referring to FIGS. 3, 4, and 6, at block 610, it may be determined whether an AC power outage occurred. When an AC power outage occurs, the first power supply (e.g., the off-line power supply 310) may cease functioning to provide the secondary voltage Vsec. The control circuit (e.g., the control circuit 350) may determine that the secondary voltage Vsec is approximately equal to (e.g., within 100 mV or another voltage value) a threshold voltage, for example, 3 VDC or another voltage. In response to determining that an AC power outage has not occurred (610—N) the control circuit may continue monitoring the secondary voltage Vsec.

In response to determining that an AC power outage has occurred (610—Y), at block 615, nonessential circuitry in the electricity meter may be disabled. The control circuit may activate switch circuitry (e.g., the switch circuitry 335 via the control signal 354) to disconnect any additional circuitry (e.g., the auxiliary circuitry 340) that is nonessential for operation of the electricity meter during an AC power outage.

At block 620, the control circuit may disable the AMI radio and/or the AMR radio. In some implementations, the control circuit may cause the AMI radio and/or the AMR radio to enter a "last gasp" mode via the control signal 352 to the third power supply 325 that provides power to the AMI radio and/or the AMR radio. In the last gasp mode, the radio may transmit a last gasp message may including a notification of the AC power outage as well as other information (e.g., energy usage, error conditions, or other electricity meter information) at the time power was lost. In some implementations, the control circuit may disable the AMI radio and/or the AMR radio via the control signal 352. The control circuit (e.g., the processor 210 of the control circuit) may transition to a low-power state.

At block 625, the control circuit may initiate control pulses (e.g., the control pulses 456) to the peak detector circuit (e.g., the peak detector circuit 480). The processor of control circuit 350 (e.g., the processor 210) may receive sensor signals (e.g., from the sensors 240) and generate the control pulses 456 when it determines that the secondary voltage Vsec is approximately equal to (e.g., within 100 mV or another voltage value) the specified threshold voltage. The control pulses 456 may have a specified frequency and duty cycle, and may be coupled to the peak detector circuit 480 via a line isolation capacitor 490.

At block 630, the primary holdup control switch (e.g., the primary holdup control switch 475) may turn on. The control pulses received by the peak detector circuit may cause the peak detector circuit to turn on the primary holdup control switch. When the primary holdup control switch turns on, the primary holdup capacitors (e.g., the primary holdup capacitors 470) may provide a portion of their stored energy to the primary DC voltage rail (e.g., the primary DC voltage rail 407).

At block 635, it may be determined whether voltage on the primary DC rail has increased to a voltage sufficient to operate the first power supply (e.g., the off-line power supply 410). In response to determining that the voltage on the primary DC rail has not increased to a voltage sufficient to operate the first power supply (635—N), the primary holdup capacitors have been depleted of energy and the process may and (block 640).

In response to determining that the voltage on the primary DC rail has increased to a voltage sufficient to operate the first power supply (635—Y), at block 645, the first power supply may begin operating again to supply the secondary voltage Vsec.

At block 650, it may be determined whether the secondary voltage Vsec exceeds a first specified threshold. While in a low-power state, the control circuit may monitor the secondary voltage Vsec to determine if the secondary voltage Vsec exceeds the first specified threshold for example, approximately 3 V DC or another voltage. In response to determining that the secondary voltage Vsec has not exceeded the first specified threshold (650—N), the control circuit may continue to monitor the secondary voltage.

In response to determining that the secondary voltage Vsec has exceeded the first specified threshold (650—Y), at block 655, the control circuit may wake-up and continue to monitor the secondary voltage Vsec.

At block 660, it may be determined whether the secondary voltage has exceeded a second specified threshold voltage, for example, 8 V DC or another voltage. In response to determining that the secondary voltage has not exceeded the second specified threshold voltage (660—N), the control circuit may continue to monitor the secondary voltage.

In response to determining that the secondary voltage Vsec has exceeded the second specified threshold voltage (660—Y), at block 665, the control circuit may cause the AMI radio and/or the AMR radio (e.g., the AMI radio and/or the AMR radio 330) to attempt another last gasp communications to the head-end system.

At block 670, the control pulses may be turned off. The control circuit (e.g., the processor 210 of the control circuit) may disable the control pulses to the peak detector circuit. When the control pulses to the peak detector circuit are disabled, the primary holdup control switch may remain in an on-state, and the primary holdup capacitors may continue to provide energy to the primary DC voltage rail until the charge stored by the peak detector circuit decreases and the voltage applied to the primary holdup control switch is less than the turn-on threshold voltage of the primary holdup control switch. Turning off the primary holdup control switch may prevent the primary holdup capacitors from providing energy to the primary DC voltage rail and may conserve the energy stored in the primary holdup capacitors.

At block 675, the control circuit may continue to monitor the secondary voltage Vsec, and the process may continue at block 610.

The specific steps illustrated in FIG. 6 provide a particular method for operating an electricity meter during an AC power outage according to an embodiment of the present disclosure. Other sequences of steps may also be performed according to alternative embodiments. For example, alternative embodiments may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications.

While aspects of the present disclosure are illustrated and explained with respect to an example of an electricity meter, aspects of the present disclosure may be applied to other utility meters, for example, but not limited to, water meters, gas meters, etc., without departing from the scope of the present disclosure.

The examples and embodiments described herein are for illustrative purposes only. Various modifications or changes in light thereof will be apparent to persons skilled in the art. These are to be included within the spirit and purview of this application, and the scope of the appended claims, which follow.

What is claimed is:
1. A utility meter, comprising:
a rectifier configured to rectify an alternating current (AC) voltage from a power grid to generate a primary direct current (DC) voltage supply;
a radio configured to transmit communications including AC power outage notifications to a receiver;
a first power supply coupled to a primary DC voltage rail and configured to convert a primary DC voltage of the primary DC voltage supply to a secondary DC voltage; and
primary holdup circuitry, including:
one or more first capacitors coupled to the primary DC voltage rail and configured to store energy from the primary DC voltage supply;
a switch coupled to the one or more first capacitors; and
a control circuit configured to control the primary holdup circuitry, wherein the control circuit is configured to:
determine that the secondary DC voltage is equal to a first specified threshold voltage;
disable the radio when the secondary DC voltage is equal to the first specified threshold voltage;
generate a control signal to cause the switch to turn on and cause the one or more first capacitors to release a portion of the energy stored in the one or more first capacitors to the primary DC voltage rail; and
enable the radio when the release of the portion of the energy stored in the one or more first capacitors to the primary DC voltage rail causes the secondary DC voltage to exceed a second specified threshold voltage.

2. The utility meter of claim 1:
wherein the first power supply is further configured to cease operation when the primary DC voltage is equal to a specified threshold voltage, and
wherein the first power supply further is configured to resume operation in response to the one or more first capacitors releasing the portion of the energy to the primary DC voltage rail.

3. The utility meter of claim 2, wherein the control circuit discontinues the control signal when the first power supply resumes operation and causes the secondary DC voltage to exceed the second specified threshold voltage.

4. The utility meter of claim 1, further comprising a detector circuit coupled to the switch and configured to control the switch based on the control signal from the control circuit.

5. The utility meter of claim 4, wherein the control signal is a pulse waveform, and
wherein the detector circuit is configured to receive the control signal and cause the switch to turn on after a time period determined by a frequency and a duty cycle of the pulse waveform.

6. The utility meter of claim 1,
wherein the control circuitry is further configured to generate a signal to the radio to cause the radio to enter a low power mode between transmission attempts upon determining that the secondary DC voltage is equal to the first specified threshold voltage.

7. The utility meter of claim 1, wherein the receiver comprises a head-end system, another utility meter, or a mobile device.

8. The utility meter of claim 1, further comprising switching circuitry configured to disconnect auxiliary circuitry of the utility meter based on a signal received from the control circuit,
wherein the control circuit is further configured to generate the signal to the switching circuitry upon determining that the secondary DC voltage is equal to the first specified threshold voltage.

9. The utility meter of claim 1, wherein the switch comprises a metal-oxide-semiconductor field-effect transistor (MOSFET).

10. A primary holdup circuit for a utility meter, the primary holdup circuit comprising:
one or more first capacitors coupled to a primary direct current (DC) voltage rail and configured to store energy from a primary DC voltage supply;
a switch coupled to the one or more first capacitors; and
a control circuit configured to control the primary holdup circuit, wherein the control circuit is configured to:
determine that a secondary DC voltage, converted from a primary DC voltage of the primary DC voltage supply by a first power supply coupled to the primary DC voltage rail, is equal to a first specified threshold voltage; and
generate a control signal to cause the switch to turn on and cause the one or more first capacitors to release a portion of the energy stored in the one or more first capacitors to the primary DC voltage rail;
wherein the control circuit is further configured to:
disable a radio of the utility meter when the secondary DC voltage is equal to the first specified threshold voltage; and
enable the radio of the utility meter when the release of the portion of the energy stored in the one or more first capacitors to the primary DC voltage rail causes the secondary DC voltage to exceed a second specified threshold voltage.

11. The primary holdup circuit of claim 10, wherein the control circuit is configured to generate the control signal when a power outage of an alternating current (AC) voltage from a power grid is determined, and
wherein the control circuit determines the outage when the secondary DC voltage is equal to the first specified threshold voltage.

12. The primary holdup circuit of claim 10, further comprising a detector circuit coupled to the switch and configured to control the switch based on the control signal from the control circuit.

13. The primary holdup circuit of claim 12, wherein the control signal is a pulse waveform, and
wherein the detector circuit is configured to receive the control signal and cause the switch to turn on after a time period determined by a frequency and a duty cycle of the pulse waveform.

14. The primary holdup circuit of claim 10, further comprising switching circuitry configured to disconnect auxiliary circuitry from a secondary DC voltage supply based on a signal received from the control circuit,
wherein the control circuit is further configured to generate the signal to the switching circuitry upon determining that the secondary DC voltage is equal to the first specified threshold voltage.

15. The primary holdup circuit of claim 10, wherein the switch comprises a metal-oxide-semiconductor field-effect transistor (MOSFET).

16. A method of operating a utility meter during a power outage, the method comprising:
rectifying, by a rectifier, an alternating current (AC) voltage from an AC power grid to generate a primary direct current (DC) voltage supply;
converting, by a first power supply, a primary DC voltage of the primary DC voltage supply to a secondary DC voltage;
determining, by a control circuit, that the power outage occurred on the AC power grid based on sensing the secondary DC voltage is equal to a first specified threshold DC voltage;
generating, by the control circuit, a control signal to a primary holdup circuit comprising one or more first capacitors coupled to a primary DC voltage rail and configured to store energy from the primary DC voltage supply, and a switch coupled to the one or more first capacitors,
wherein the control signal causes the switch to discharge energy from the one or more first capacitors coupled to the primary DC voltage rail, and
wherein the control signal is further operable to disable a radio;
wherein the method further comprises generating a second control signal when the secondary voltage exceeds a second specified threshold voltage, wherein the second control signal is operable to activate the radio.

17. The method of claim 16, further comprising discontinuing the control signal when the secondary voltage exceeds the second specified threshold voltage.

18. The method of claim 16, further comprising activating a switching power supply when a voltage on the primary DC voltage rail exceeds a specified threshold voltage resulting from the energy discharged from the one or more first capacitors.

19. The method of claim 16, wherein the control circuit enters a low-power mode prior to generating the control signal to the primary holdup circuit.

\* \* \* \* \*